US012651993B2

(12) United States Patent
Erotas et al.

(10) Patent No.: US 12,651,993 B2
(45) Date of Patent: Jun. 9, 2026

(54) FILTER FOR A MOTOR DRIVE

(71) Applicant: Collins Aerospace Ireland, Limited, Dublin (IE)

(72) Inventors: Georgios Erotas, Enschede (NL); Ignacio Castro Álvarez, Gijón (ES)

(73) Assignee: Collins Aerospace Ireland, Limited, Cork (IE)

( * ) Notice: Subject to any disclaimer, the term of this patent is extended or adjusted under 35 U.S.C. 154(b) by 207 days.

(21) Appl. No.: 18/441,602

(22) Filed: Feb. 14, 2024

(65) Prior Publication Data

US 2024/0275327 A1     Aug. 15, 2024

(30) Foreign Application Priority Data

Feb. 14, 2023     (EP) ..................................... 23386013

(51) Int. Cl.
| | |
|---|---|
| *H02P 29/50* | (2016.01) |
| *H02P 27/08* | (2006.01) |
| *H03H 1/00* | (2006.01) |

(52) U.S. Cl.
CPC .............. *H02P 29/50* (2016.02); *H02P 27/08* (2013.01); *H03H 1/0007* (2013.01)

(58) Field of Classification Search
CPC ........ H02M 1/123; H02M 1/126; H02M 1/12; H02M 7/5387; H02M 1/14; H02M 7/5395;

(Continued)

(56) References Cited

U.S. PATENT DOCUMENTS 5,990,654 A * 11/1999 Skibinski ................ H02P 27/08
363/41
7,116,076 B2 10/2006 Sippola et al.
(Continued)

FOREIGN PATENT DOCUMENTS

CN        206148946 U     5/2017
CN        106788118 B     5/2019
(Continued)

OTHER PUBLICATIONS

"Robert W. Erickson, Optimal single resistor Damping of Input Filters, Mar. 14-18, 1999, IEEE, pp. 1-7". (Year: 1999).*

(Continued)

*Primary Examiner* — Antony M Paul
(74) *Attorney, Agent, or Firm* — Suiter Swantz IP

(57)        ABSTRACT

A filter for a motor drive includes a plurality of phase lines configured to connect an output of a power source to an input of a motor. The power source is configured to supply at the output a voltage that switches between a high voltage state and a low voltage state. The filter includes a plurality of capacitors, where each capacitor is connected between one of the plurality of phase lines and a ground. The filter further includes a plurality of primary inductors, where each phase line includes one of the plurality of primary inductors. The filter includes a plurality of secondary inductors and a plurality of resistors. Each secondary inductor is connected in series with one of the plurality of resistors and each primary inductor is connected in parallel to one of the plurality of secondary inductors and one of the plurality of resistors.

16 Claims, 7 Drawing Sheets

(58) Field of Classification Search
CPC ........ H02M 7/523; H02P 27/08; H02P 29/50; H02P 27/06; B60L 50/60; B60L 53/53; B60L 9/005; H02H 3/165; H02H 7/122; H04B 3/28; H04B 3/30; H04B 2203/5466; H04B 2203/5491
See application file for complete search history.

(56) References Cited

U.S. PATENT DOCUMENTS

| | | | |
|---|---|---|---|
| 7,768,373 | B2 | 8/2010 | Shudarek |
| 8,115,444 | B2 | 2/2012 | De et al. |
| 8,362,733 | B2 | 1/2013 | Inuduka et al. |
| 10,283,262 | B2 | 5/2019 | Pagenkopf |
| 2006/0043920 | A1 | 3/2006 | Baker |
| 2014/0217980 | A1 | 8/2014 | Malrieu et al. |
| 2015/0381136 | A1 | 12/2015 | Oswald |
| 2017/0372835 | A1 | 12/2017 | Chai et al. |
| 2021/0083613 | A1 | 3/2021 | Popek et al. |

FOREIGN PATENT DOCUMENTS

| | | |
|---|---|---|
| EP | 2408093 A2 | 1/2012 |
| JP | 2001204136 A | 7/2001 |
| WO | 2012109703 A1 | 8/2012 |
| WO | 2015180558 A1 | 12/2015 |
| WO | 2016016524 A1 | 2/2016 |

OTHER PUBLICATIONS

European Search Report dated Jul. 18, 2023; European Application No. 23386013.9.
Mahesh M. Swamy et al. "New Normal mode dv/dt Filter With a Built-In Resistor Failure Detection Circuit" IEEE Transactions on Industry Applications, vol. 53, Non. 3, May/Jun. 2017.
Robert W. Erickson "Optimal Single Resistor Damping of Input Filters" Colorado Power Electronics Center, University of Colorado, Boulder, Colorado, 80309-0425.
European Patent Office, Examination Report received in EP Application No. 23386013.9, Nov. 14, 2025, 8 pages.

* cited by examiner

FILTER FOR A MOTOR DRIVE

CROSS-REFERENCE TO RELATED APPLICATIONS

The present application claims the benefit of European Patent Application No. 23386013, entitled Filter for a Motor Drive, filed Feb. 14, 2023, which is incorporated by reference in the entirety.

TECHNICAL FIELD

This disclosure relates to a filter for a motor drive. In some examples, the disclosure relates to a filter for a motor drive that uses a pulse width modulated (PWM) signal to drive the motor.

BACKGROUND

In many examples, motors are driven by a pulse width modulated (PWM) signal (e.g. from an inverter). However, in some systems, there may be a substantial physical distance between the motor and the source of the PWM signal (for example, up to around 100 metres). This necessarily results in the use of long cables to connect the motor to the source of the PWM signal (e.g. inverter). However, this may lead to several undesirable effects.

First, there may be a substantial common-mode current, in particular at the output of the motor drive. This may result in damage to the motor shaft and bearings.

Second, the system may suffer from transmission line effects. These may be caused by the length of the wire and/or the high rate of change of voltage at the output of the inverter due to the PWM output signals. Transmission line effects may result in a large overshoot in the voltage at the motor terminals. In some examples, this overshoot may exceed the maximum voltage rating of the motor. This may result in a deterioration of the insulation of the turn-to-turn windings of the motor.

FIG. 1 is a plot of voltage over time at the output of a typical motor drive with a long cable between the output of the power source and the input of the motor, which shows an example of voltage overshoot. Line A is the voltage at the source of the PWM signal (e.g. output of the inverter) and Line B is the voltage at the motor terminals. The peak voltage at the motor terminals is around two times larger than the source voltage, indicating a significant overshoot.

The present disclosure aims to address some of these problems by providing a filter for a motor drive.

SUMMARY

According to a first aspect of the present disclosure, there is provided a filter for a motor drive including: a plurality of phase lines configured to connect an output of a power source to an input of a motor, where the power source is configured to supply at the output a voltage that switches between a high voltage state and a low voltage state; a plurality of capacitors, where each capacitor is connected between one of the plurality of phase lines and a ground; a plurality of primary inductors, where each phase line includes one of the plurality of primary inductors; and a plurality of secondary inductors and a plurality of resistors; where each of the secondary inductors is connected in series with one of the plurality of resistors; and where each of the plurality of primary inductors is connected in parallel to one of the plurality of secondary inductors and one of the plurality of resistors.

The plurality of phase lines are configured to provide a conductive path between the output of the power source, the filter and the input of the motor. The phase lines may be any suitable and desired type. In some examples, the phase lines may include an electrical cable or a wire including conductive material (e.g. copper, aluminium).

The power source may be any suitable and desired type. In some examples, the power source may include a plurality of terminals each configured to provide a voltage output. The plurality of terminals may all provide substantially the same output, or at least one of the plurality of terminals may provide a different output (e.g. a different voltage level). In some examples, each of the plurality of terminals of the power source is connected to one of the plurality of phase lines of the filter.

In some embodiments, the power source includes a DC power source and an inverter. The DC power source may be connected to the inverter in any suitable and desired way. In some examples, the DC power source is connected to the inverter by a plurality of conductors. The number of conductors connected between the DC power source and inverter may be different to the number of phase lines of the filter. In some examples, the DC power source is connected to the inverter by two conductors, one of which is configured as a high voltage state, and the other configured as a low voltage or ground state.

In some examples, the power source includes an AC power source, a rectifier, and an inverter. The AC power source may be any suitable and desired type. In some examples, the AC power source is a three-phase power source. In some examples, the AC power source is a mains source.

The AC power source may be connected to the rectifier in any suitable and desired way. In some examples, the AC power source is connected to the rectifier by a plurality of conductors. The number of conductors connected between the AC power source and rectifier may be different to the number of phase lines of the filter.

The rectifier may be connected to the inverter in any suitable and desired way. In some examples, the rectifier is connected to the inverter by a plurality of conductors. The number of conductors connected between the rectifier and inverter may be different to the number of phase lines of the filter.

The motor may be any suitable and desired type. In some examples, the motor is a multi-phase motor. The motor may include a plurality of input terminals. In some examples, each of the plurality of input terminals of the motor is connected to one of the plurality of phase lines. In some examples, the number of phase lines of the filter is the same as the number of input terminals of the motor. In some examples, the number of output terminals of the voltage source is the same as the number of input terminals of the motor.

The plurality of capacitors may be any suitable and desired type. In some examples, the capacitance of the plurality of capacitors is in the pico-Farad (pF) range.

In some examples, the plurality of capacitors may be configured to operate as a low-pass filter. The complex impedance of a capacitor is inversely proportional to the frequency of the signal. Therefore, a high frequency signal experiences a low impedance from the capacitor and travels through the capacitor to ground. However, a low frequency signal experiences a high impedance from the capacitor, meaning that low frequency signals do not travel through the capacitor, and instead continue to travel along the phase lines.

In some embodiments, the plurality of primary inductors are coupled together. In some examples, the plurality of primary inductors are coupled together in phase. In some embodiments, the plurality of primary inductors are configured to operate as a common-mode choke filter. The plurality of primary inductors may be wound around a common core. The plurality of primary inductors may be wound in the same direction around a common core. The plurality of primary inductors may have the same number of windings and/or the same turn angle around a common core.

Common-mode currents travel in the same direction along each of the lines of the motor drive. Hence, when the primary inductors are configured to operate as a common-mode choke filter as described above, a magnetic field is induced in the same direction in each of the inductors. The high combined strength of these magnetic fields prevents current from flowing (e.g. around the core), thus helping to suppress the common-mode currents.

Conversely, in differential mode, current flows along at least one of the lines in an opposing direction. Hence, when the primary inductors are configured to operate as a common-mode choke filter as described above, a magnetic field is induced in an opposing direction in at least one of the inductors. The magnetic fields at least partially cancel, meaning that the combined strength of the magnetic field is lower in comparison to that of the common-mode, and current is not prevented from flowing. Therefore, the common-mode choke is arranged to substantially not suppress differential-mode currents.

In some embodiments, the plurality of secondary inductors are coupled together. In some examples, the plurality of secondary inductors are coupled together in phase. In some embodiments, the plurality of secondary inductors are configured to operate as a common-mode choke filter. The plurality of primary inductors may be wound around a common core. The plurality of primary inductors may be wound in the same direction around a common core. The plurality of primary inductors may have the same number of windings and/or the same turn angle around the common core. The common-mode choke filter may operate in the same manner as described above.

In some embodiments, each of the plurality of capacitors is connected to one of the plurality of phase lines between an output of the power source and an input of one of the plurality of primary inductors. Each of the plurality of capacitors are therefore located upstream of the primary inductor connected to the same phase line. The plurality of capacitors may help to reduce the magnitude of high frequency currents passing into other components of the filter, which may help to reduce the size and/or weight of these components (in particular, this may help to reduce the size and/or weight of the core(s) around which the inductors may be wound). In some examples, the capacitors may help to attenuate the voltage at the output of the filter by approximately an additional 20 dB/dec compared to using the other components of the filter alone.

In some embodiments, the plurality of secondary inductors each have a lower inductance than the plurality of primary inductors. This may help to ensure that the primary and secondary inductors are configured to filter different frequency signals. This may also help to reduce the overall size and/or weight of the filter.

In some embodiments, the length of the phase lines between the output of the power source and the input of the filter is smaller than the length of the phase lines between the output of the filter and the input of the motor. In some examples, the length of the phase lines between the output of the power source and the input of the filter is much smaller (e.g. more than an order of magnitude smaller) than the length of the phase lines between the output of the filter and the input of the motor. In some examples, the input of the filter may be directly connected to the output of the power source (i.e. an output terminal of the power source), meaning that the length of the phase lines between the output of the power source and the input of the filter is substantially zero.

In some embodiments, the properties (e.g. capacitance, inductance and/or resistance) of the components of the filter may be selected according to the desired behaviour of the filter. For example, the properties (e.g. capacitance, inductance and/or resistance) of the components of the filter may be selected such that the filter has a desired impedance and/or voltage transfer function (e.g. how the impedance and/or voltage transfer function varies with the frequency of the signal). In some examples, the desired behaviour of the filter may be the same for each phase line of the filter. In some embodiments, each of the plurality of capacitors have substantially the same capacitance. In some embodiments, each of the plurality of primary inductors have substantially the same inductance. In some embodiments, each of the plurality of secondary inductors have substantially the same inductance. In some embodiments, each of the plurality of resistors have substantially the same resistance.

In some embodiments, the power source is configured to supply at the output a pulse width modulated (PWM) voltage. The duty cycle of the PWM signal may be varied (e.g. to achieve a desired signal profile and/or a desired rotational speed of the motor). In embodiments including a power source with a plurality of outputs, each terminal may have any suitable and desired PWM signal. The plurality of terminals may all provide substantially the same output, or at least one of the plurality of terminals may provide a different output. For example, one of the plurality of outputs may be active (e.g. in a high voltage state), while another of the plurality of outputs is inactive (e.g. in a low voltage state).

In some embodiments, the filter includes three phase lines, three capacitors, three primary inductors, three secondary inductors, and three resistors. In some examples, the number of phase lines is the same as the number of phases of the motor. Therefore, this embodiment of the filter may be connected to a three-phase motor.

According to a second aspect of the present disclosure, there is provided a motor drive including: a power source, where the output of the power source is configured to switch between a high voltage state and a low voltage state; and a motor; where the output of the power source is connected to the input of the motor via a filter including any of the features described above.

BRIEF DESCRIPTION OF THE DRAWINGS

Certain examples of the present disclosure will now be described with reference to the accompanying drawings in which.

DETAILED DESCRIPTION

Figure 2:
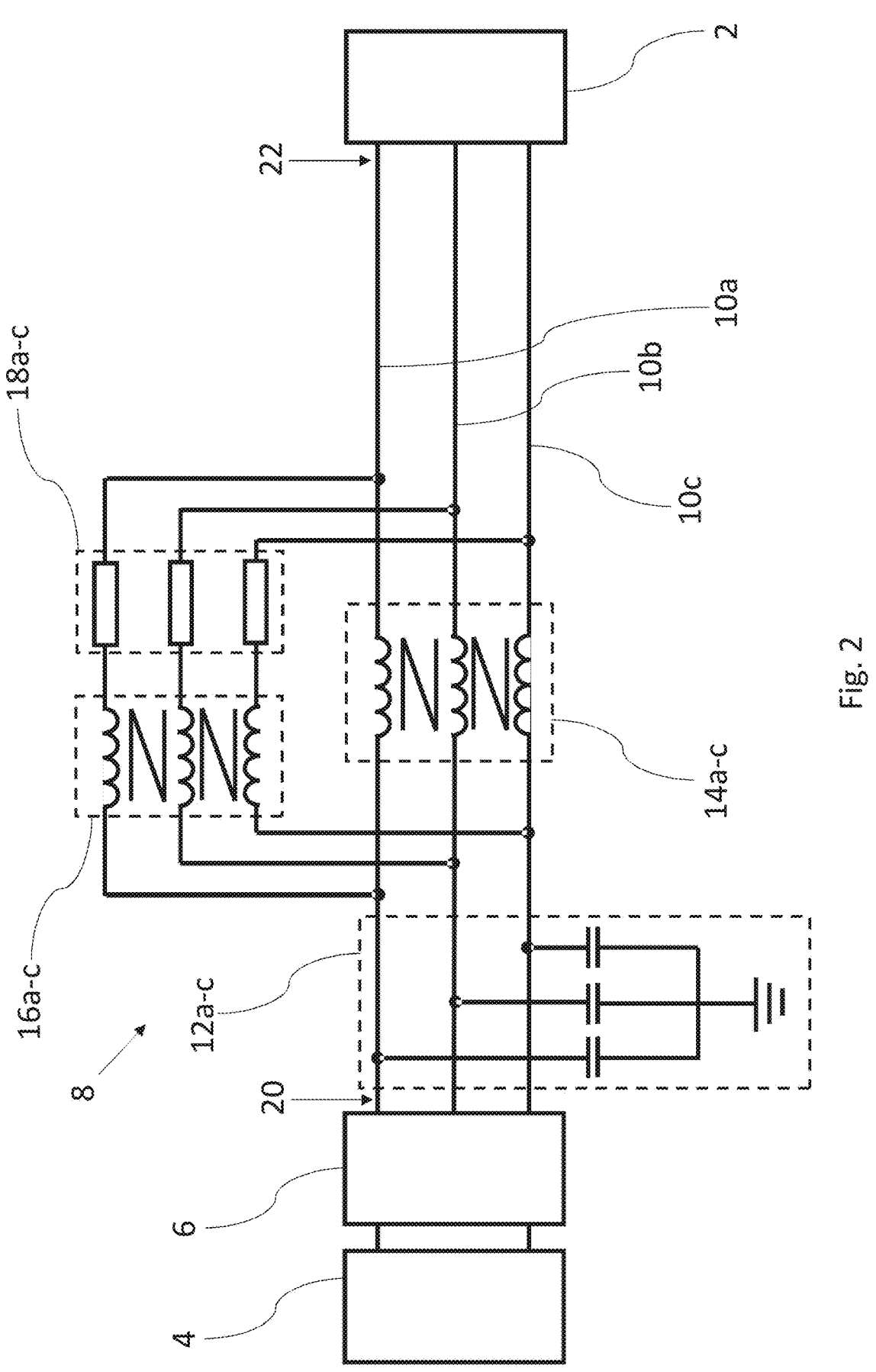
FIG. 2 is a circuit diagram of a filter, in accordance with one or more embodiments of the present disclosure.

FIG. 2 is a circuit diagram of a filter according to an example of the present disclosure.

In the example shown in FIG. 2, the input of a motor 2 is connected to an DC power source 4 via an inverter 6. The motor 2, DC power source 4 and inverter 6 can be any suitable and desired types. The motor may be driven by any voltage source configured to switch between a high voltage output and a low voltage output (i.e. the motor may not be driven by a DC power source 4 and an inverter 6 specifically).

In this example, the motor 2 is a three-phase motor. The motor 2 is connected to the inverter 6 by three lines 10a-c. However, in some examples, the motor 2 may be a single-phase motor or a polyphase motor (e.g. a six-phase motor). Therefore, the number of lines 10a-c may vary depending upon the requirements of the system. In some examples, the motor 2 and inverter 6 are separated by a distance of up to around 100 metres.

The system shown in FIG. 2 further includes a filter 8. On each of the lines 10a-c, the filter 8 includes a capacitor 12a-c, a primary inductor 14a-c, a secondary inductor 16a-c and a resistor 18a-c.

Each of the capacitors 12a-c is connected between a respective line 10a-c and the ground. In this example, the capacitors 12a-c are connected to a node directly downstream of the inverter 6. In some examples, the capacitors 12a-c may each be connected to a node an output terminal of the inverter 6 (i.e. directly connected to the output of the inverter 6).

In some examples, each of the capacitors 12a-c may provide a low-pass filter. High frequency signals experience a low impedance from the capacitors 12a-c and pass through the capacitor 12a-c to ground. Low frequency signals experience a higher impedance from the capacitors 12a-c and pass through lines 10a-c towards the motor 2. Therefore, the capacitors 12a-c may help to filter out high frequency signals which can be associated with common-mode currents.

In this example, the capacitors 12a-c are situated upstream of the other components of the filter 8 (i.e. closer to the first terminal 20 of lines 10a-c). This may help to filter high frequency signals upstream of the inductors 14a-c, 16a-c. This may help to reduce the inductance required, which may help to reduce the size and/or weight of the inductors 14a-c, 16a-c.

Each of the lines 10a-c includes a primary inductor 14a-c. In this example, the primary inductors 14a-c are downstream of the node connecting the capacitor 12a-c to the line 10a-c. The primary inductors 14a-c are coupled together (e.g. wound around a common core). The primary inductors 14a-c together form a primary common-mode choke filter.

Common-mode currents travel in the same direction along each of the lines 10a-c of the motor drive. Hence, when the primary inductors 14a-c are coupled (e.g. wound around a common core) and common-mode current flows through the inductors 14a-c, a magnetic field is induced in the same direction in each of the inductors 14a-c. The high combined strength of these magnetic fields prevents current from flowing (e.g. around the core), thus suppressing the common-mode currents.

Conversely, in differential mode, current flows along at least one of the lines 10a-c in an opposing direction. Hence, when the primary inductors 14a-c are coupled (e.g. wound around a common core) and differential-mode current flows through the inductors 14a-c, a magnetic field is induced in an opposing direction in at least one of the inductors 14a-c. The magnetic fields at least partially cancel, meaning that the combined strength of the magnetic field is lower in comparison to that of the common-mode, and current is not prevented from flowing. Therefore, the common-mode choke is arranged to substantially not suppress differential-mode currents.

Each of the primary inductors 14a-c is connected in parallel to a secondary inductor 16a-c and a resistor 18a-c connected in series. The secondary inductors 16a-c are coupled together (e.g. wound around a common core). Therefore, the secondary inductors 16a-c together form a secondary common-mode choke filter.

The operation of the secondary common-mode choke filter is substantially the same as that described above regarding the primary common-mode choke filter. In some examples, the secondary inductors 16a-c of the secondary common-mode choke filter may be smaller (i.e. lower inductance) than the primary inductors 14a-c. In some examples, the primary inductors 14a-c may filter different frequency components to the secondary inductors 16a-c.

In this example, the filter includes three capacitors 12a-c, three primary inductors 14a-c, three secondary inductors 16a-c and three resistors 18a-c. However, it will be understood that the number of each of these components may be selected according to the requirements of the system. For example, a six-phase motor may have six phase lines, meaning that six of each of the above components are required, rather than three.

In FIG. 2, the filter 8 is shown to occupy a significant proportion of the space between the motor 2 and the inverter 6. However, it will be understood that in many examples the filter 8 may be much smaller than the length of the lines 10a-c, and that the various components of the filter 8 may be situated anywhere along the length of the lines 10a-c. In some examples, the filter 8 is closer to the inverter 6 than the motor 2.

Figure 3:
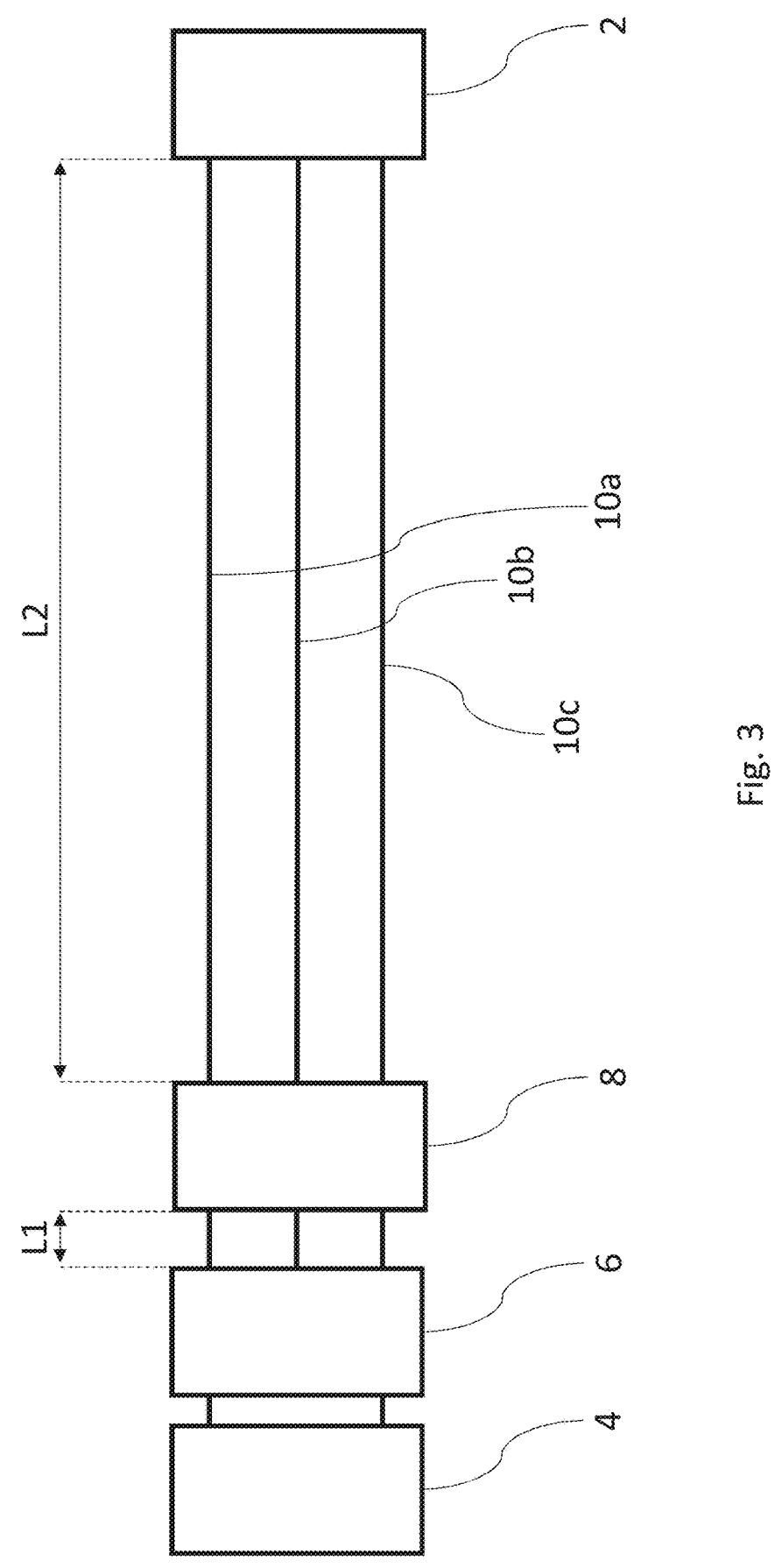
FIG. 3 is a schematic diagram of a motor drive including a filter, in accordance with one or more embodiments of the present disclosure.

FIG. 3 is a schematic diagram of a motor drive including a filter according to an example of the present disclosure. In this embodiment, the distance between the output of the inverter 6 and the input of the filter 8 is L1, and the distance between the output of the filter 8 and the input of the motor 2 is L2. In some examples, the distance L2 is much greater than the distance L1 (e.g. more than an order of magnitude greater). In some examples, the distance L1 may be zero, meaning that at least part of the filter 8 is situated at the output terminals of the inverter 6 (i.e. directly connected to the output terminals of the inverter 6).

Figure 4:
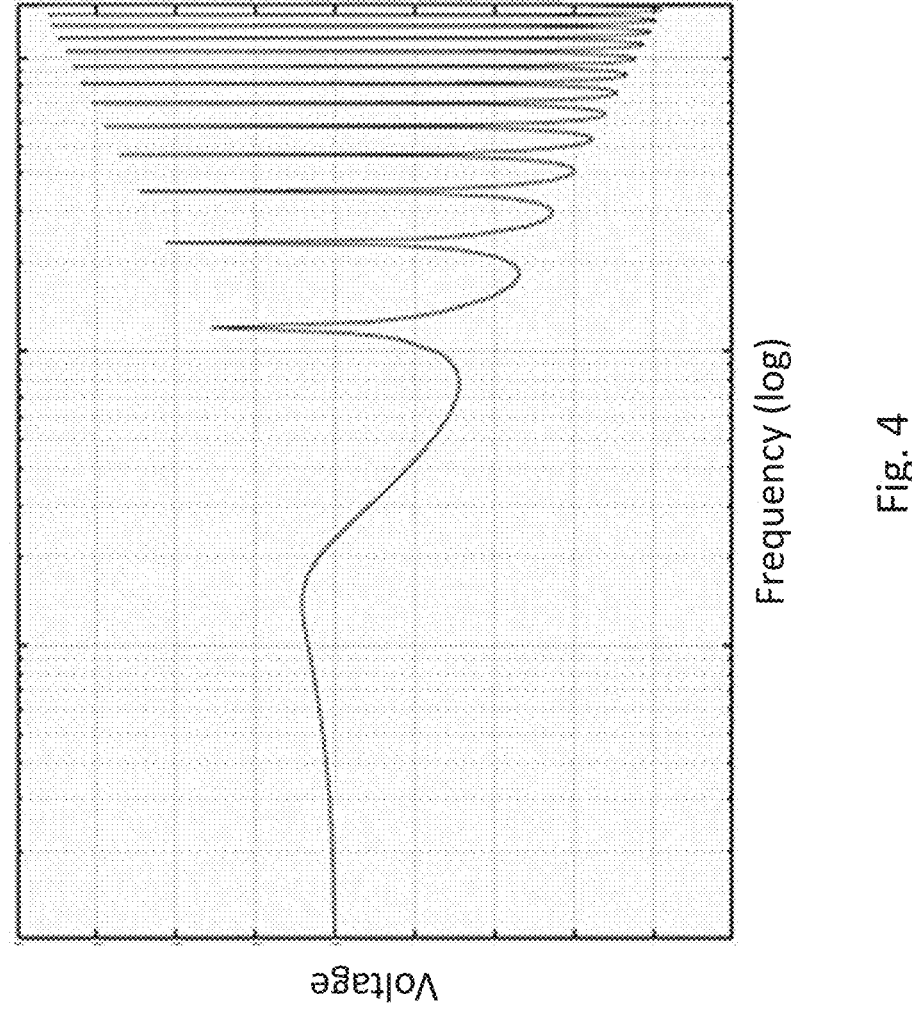
FIG. 4 is a plot of a voltage transfer function of a filter, in accordance with one or more embodiments of the present disclosure.

FIG. 4 is a plot of a voltage transfer function of a filter according to an example of the present disclosure. The magnitude of the voltage at the input to the motor 2 (i.e. at the second terminal 22 of lines 10*a-c*) varies with frequency. At lower frequencies, the magnitude of the voltage is largely unaffected by the filter 8. However, the filter 8 attenuates the voltage at higher frequencies. This may help to suppress common-mode currents and transmission line effects.

Figure 5:
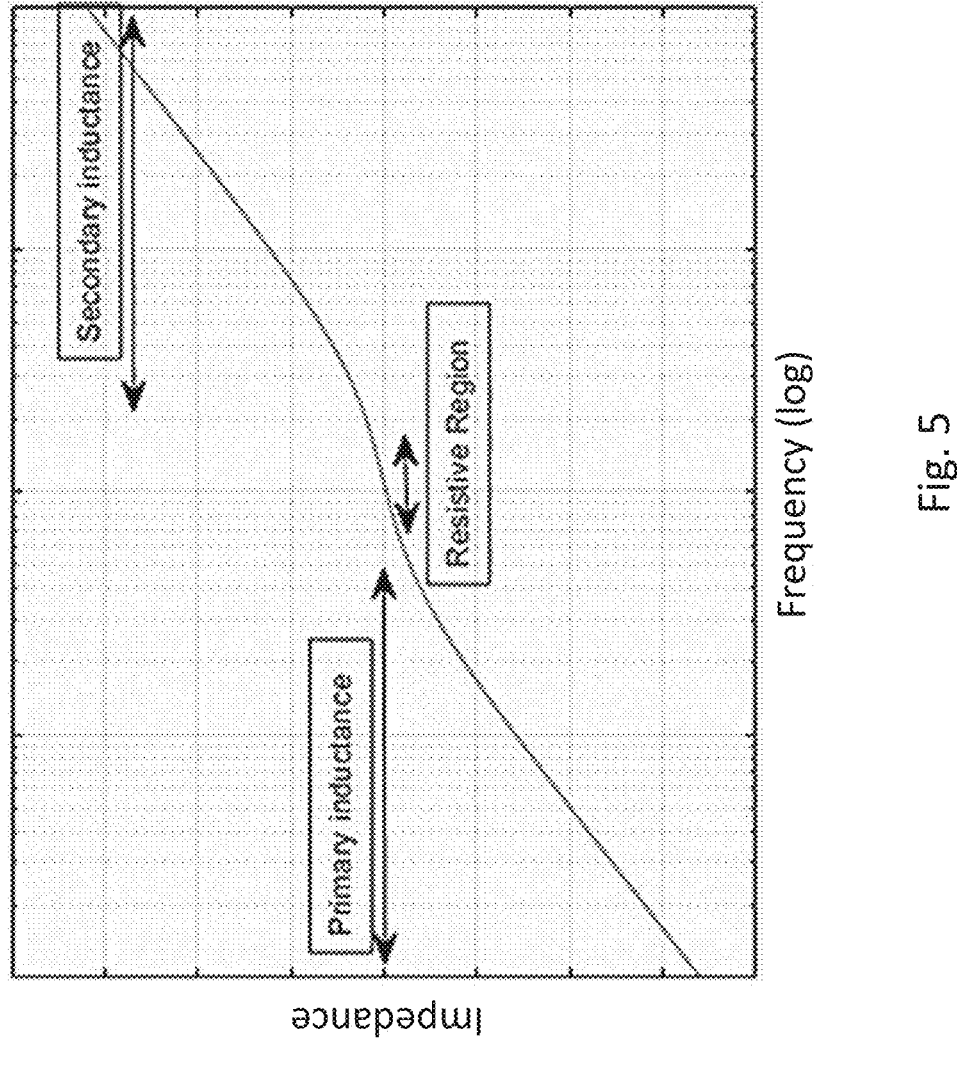
FIG. 5 is a plot of an input impedance curve of a filter, in accordance with one or more embodiments of the present disclosure.

FIG. 5 is a plot of an input impedance curve of a filter according to an example of the present disclosure. The magnitude of the impedance varies with frequency. At low frequencies, the impedance of the filter 8 increases substantially logarithmically with frequency. This region is indicated on FIG. 5 as the 'Primary inductance' region. The impedance at lower frequencies is relatively low, indicating that the filter does not substantially affect lower frequency signals.

In the central region of FIG. 5, there is a region of substantially constant impedance which is indicated as the 'Resistive region'. In some examples, the frequency at which the 'Resistive region' occurs is substantially the same as the frequency of the first reflection of the lines 10*a-c*. This may help to reduce the reflection coefficient of the first terminal 20 of the lines 10*a-c* (i.e. at the output of the inverter 6).

The frequency at which the 'Resistive region' occurs depends upon the properties (e.g. resistance, capacitance and/or inductance) of the components of the filter. Therefore, the components of the filter 8 may be chosen such that the 'Resistive region' occurs is substantially the same as the frequency of the first reflection of the lines 10*a-c*.

At higher frequencies, the impedance of the filter 8 continues to increase substantially logarithmically with frequency. This region is indicated on FIG. 5 as the 'Secondary inductance' region. The high impedance in this region may help to reduce the common-mode current by helping to suppress high-frequency signals.

Figure 1:
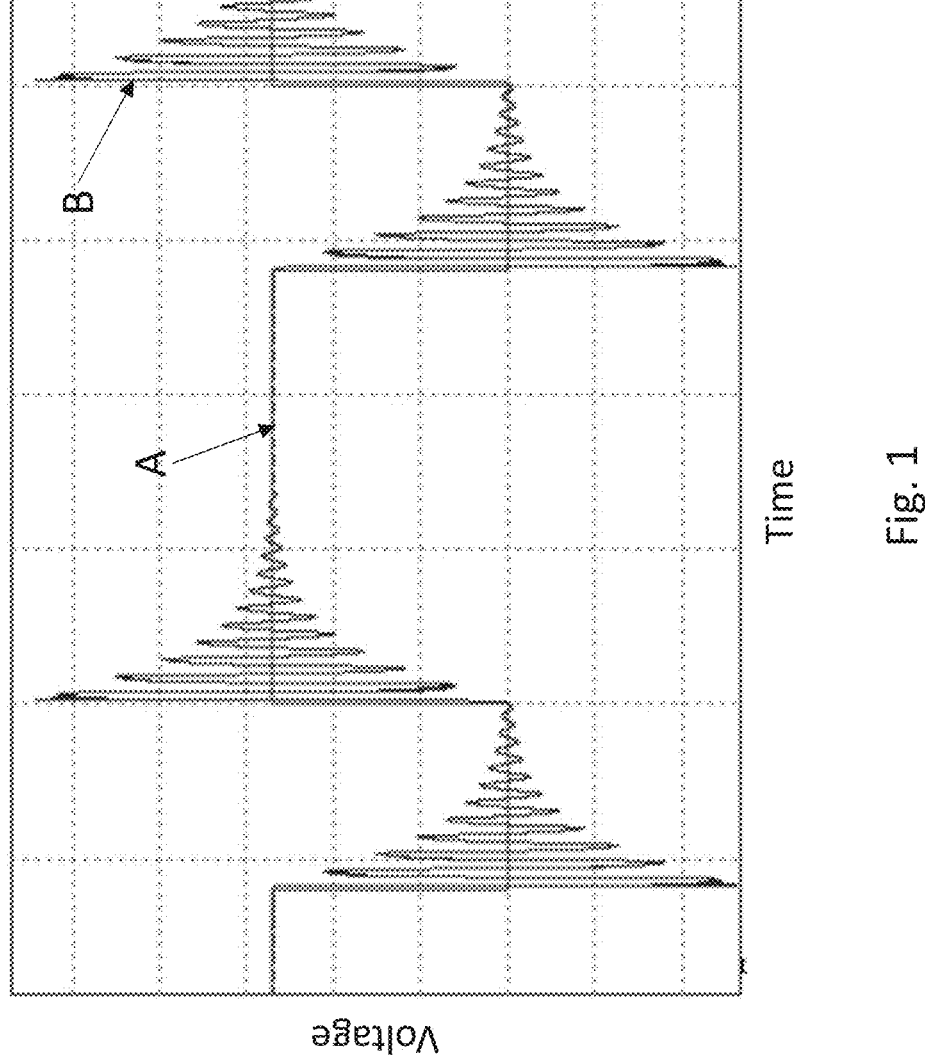
FIG. 1 is a plot of voltage over time at the output of a typical motor drive with a long cable between the output of the power source and the input of the motor.
Figure 6:
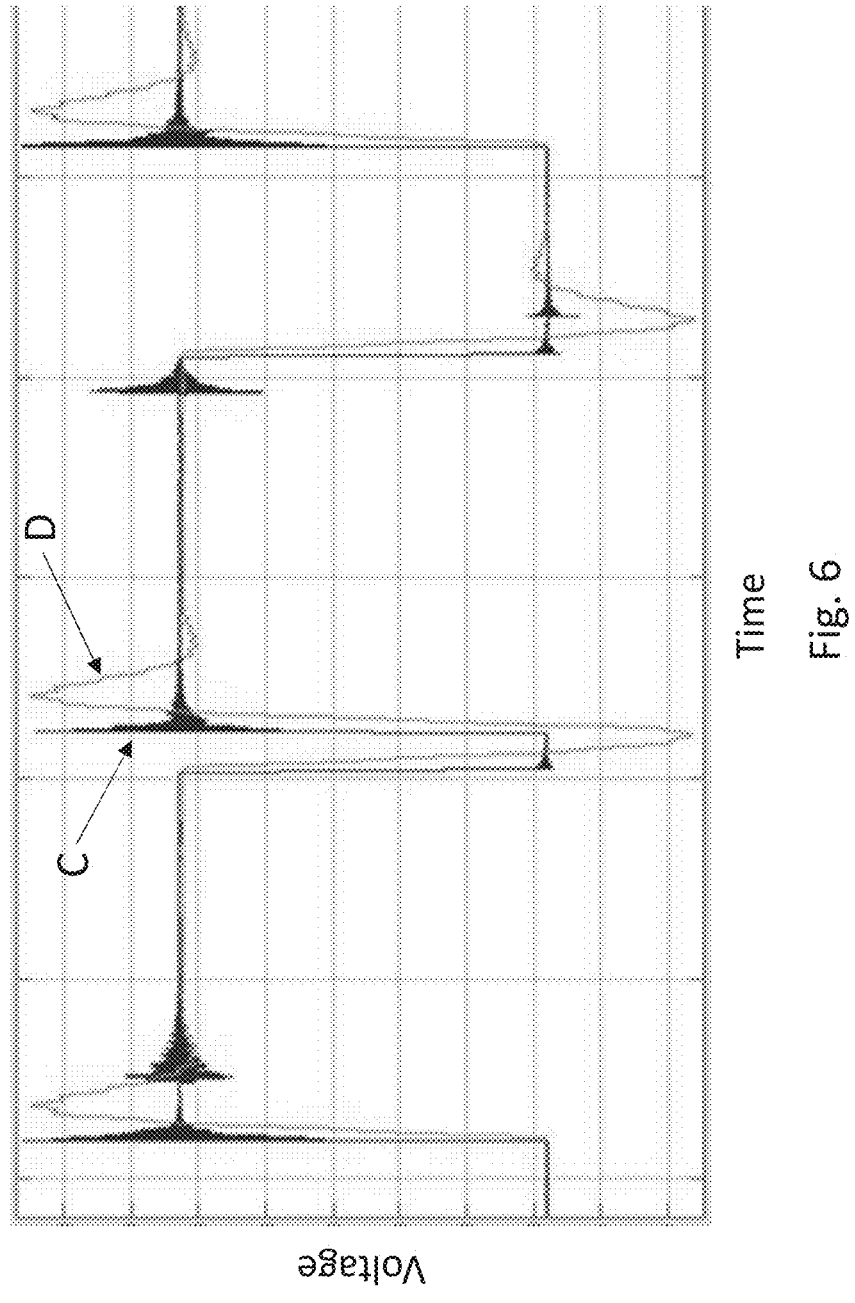
FIG. 6 is a plot of voltage over time at the output of a filter, in accordance with one or more embodiments of the present disclosure.

FIG. 6 is a plot of voltage over time of a filter 8 according to an example of the present disclosure. Line C is the voltage at the output of the inverter 6 and Line D is the voltage at the input terminals of the motor 2. The peak voltage at the input terminals of the motor 2 is around 1.38 times the peak voltage at the output of the inverter 6. The overshoot is therefore reduced compared to a system without a filter (e.g. as shown in FIG. 1 and discussed above).

Figure 7:
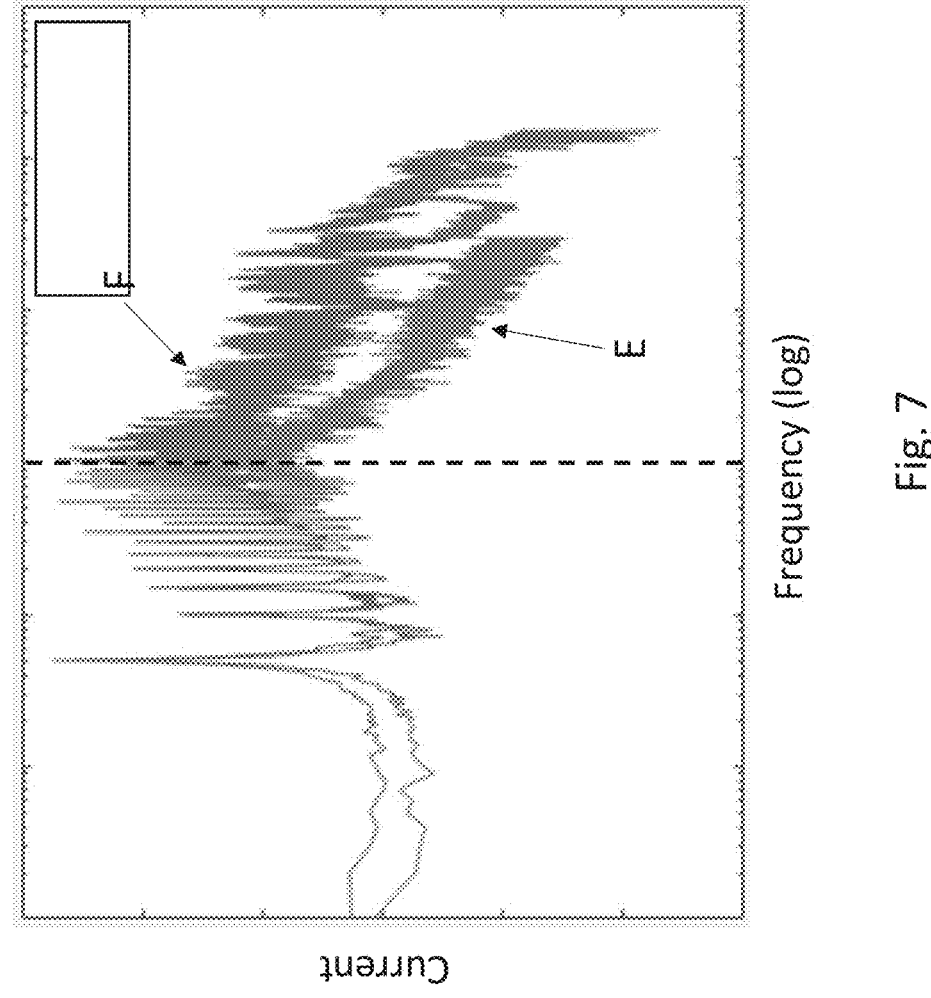
FIG. 7 is a plot of the common-mode current at the output of a filter, in accordance with one or more embodiments of the present disclosure.

FIG. 7 is a plot of the common-mode current at the output of a filter 8 according to an example of the present disclosure. Lines E and F are the common-mode current at the input of the motor 2 with and without a filter 8 respectively.

At lower frequencies (e.g. for frequencies lower than the vertical dotted line indicated on FIG. 7) the common-mode current at the input of the motor 2 is broadly similar for systems with and without a filter 8. This indicates that the filter 8 does not substantially affect the behaviour of the motor drive at low frequencies.

However, for higher frequencies (e.g. for frequencies higher than the dotted line indicated on FIG. 7), the common-mode current at the output is lower for systems with a filter 8 than for systems without a filter 8. This indicates that a filter 8 according to an example of the present disclosure may help to attenuate higher frequency signals in the common-mode current.

The dotted line shown in FIG. 7 therefore represents a frequency at which the filter 8 may start to attenuate the common-mode current. The value of this frequency may be varied by selecting appropriate properties of the components of the filter 8. For example, some of the properties that may affect the value of this frequency are resistance, capacitance and/or inductance of the various components, and/or the turn angle of the inductors 14*a-c*, 16*a-c* around a core. Therefore, the frequency at which the filter 8 may start to attenuate the common-mode current may be chosen according to the requirements of a particular application and/or desired behaviour of the system.

The present disclosure provides a filter for a motor drive which may help to reduce the voltage overshoot at the input of the motor and the common-mode current circulating in the motor drive. This filter may be particularly useful in systems where the physical distance between the motor and the power source is large (e.g. up to 100 metres). In these systems, transmission line effects (e.g. reflection at the power source and motor terminals) may result in a particularly large voltage overshoot at the input of the motor.

Reducing the voltage overshoot may help to ensure that the voltage at the input of the motor is within the maximum voltage rating of the motor, which may help to prevent damage to the motor shaft and bearings and/or avoid deterioration of the insulation of the turn-to-turn windings of the motor.

Common-mode currents and currents associated with transmission line effects may have high frequency. The plurality of capacitors provided in the filter of the present disclosure may provide a low-pass filter, which may help to ensure that the magnitude of high-frequency signals are reduced. In some examples of the present disclosure, the plurality of primary inductors and/or the plurality of secondary inductors may be coupled together to form common-mode choke filter(s). This may help to reduce the magnitude of the common-mode signals in the motor drive system. In embodiments where both are provided, each of the common-mode choke filters may help to provide a filter for signals of different frequencies. This may help to reduce the size and/or weight of the filter.

In some systems, reducing or minimising the common-mode current may be a regulatory requirement. Therefore, the present disclosure may help to provide a solution to meet regulatory and/or safety requirements in some systems.

The invention claimed is:

1. A filter for a motor drive comprising:
   a plurality of phase lines configured to connect an output of a power source to an input of a motor, wherein the power source is configured to supply at the output of the power source a voltage that switches between a high voltage state and a low voltage state;
   a plurality of capacitors, wherein each capacitor is connected between one of the plurality of phase lines and a ground;
   a plurality of primary inductors, wherein each phase line comprises one of the plurality of primary inductors; and
   a plurality of secondary inductors and a plurality of resistors,
   wherein each of the plurality of secondary inductors is connected in series with one of the plurality of resistors,
   wherein each of the plurality of primary inductors is connected in parallel to one of the plurality of secondary inductors and one of the plurality of resistors,
   wherein the plurality of primary inductors are coupled together.

2. The filter for a motor drive as claimed in claim 1, wherein the plurality of primary inductors are configured to operate as a common-mode choke filter.

3. The filter for a motor drive as claimed in claim 1, wherein the plurality of secondary inductors are coupled together.

4. The filter for a motor drive as claimed in claim 3, wherein the plurality of secondary inductors are configured to operate as a common-mode choke filter.

5. The filter for a motor drive as claimed in claim 1, wherein each of the plurality of capacitors is connected to one of the plurality of phase lines between the output of the power source and an input of one of the plurality of primary inductors.

6. The filter for a motor drive as claimed in claim 1, wherein the plurality of secondary inductors each have a lower inductance than the plurality of primary inductors.

7. The filter for a motor drive as claimed in claim 1, wherein a length of the plurality of phase lines between the output of the power source and the input of the filter is smaller than a length of the plurality of phase lines between an output of the filter and an input of the motor drive.

8. The filter for a motor drive as claimed in claim 1, wherein each of the plurality of capacitors have substantially the same capacitance.

9. The filter for a motor drive as claimed in claim 1, wherein each of the plurality of primary inductors have substantially the same inductance.

10. The filter for a motor drive as claimed in claim 1, wherein each of the plurality of resistors have substantially the same resistance.

11. The filter for a motor drive as claimed in claim 1, wherein the power source is configured to supply at the output a pulse width modulated (PWM) voltage.

12. The filter for a motor drive as claimed in claim 1, wherein the power source comprises a DC power source and an inverter.

13. The filter for a motor drive as claimed in claim 1, wherein the filter comprises three phase lines, three capacitors, three primary inductors, three secondary inductors, and three resistors.

14. The filter for a motor drive as claimed in 1, wherein each of the plurality of secondary inductors have substantially the same inductance.

15. A motor drive comprising:

a power source, wherein an output of the power source is configured to switch between a high voltage state and a low voltage state; and a motor, wherein the output of the power source is connected to an input of the motor via a filter, wherein the filter comprises:

a plurality of phase lines configured to connect the output of the power source to the input of the motor;

a plurality of capacitors, wherein each capacitor is connected between one of the plurality of phase lines and a ground;

a plurality of primary inductors, wherein each phase line comprises one of the plurality of primary inductors; and a plurality of secondary inductors and a plurality of resistors, wherein each of the plurality of secondary inductors is connected in series with one of the plurality of resistors, wherein each of the plurality of primary inductors is connected in parallel to one of the plurality of secondary inductors and one of the plurality of resistors, wherein each of the plurality of capacitors is connected to one of the plurality of phase lines between the output of the power source and an input of one of the plurality of primary inductors.

16. A filter for a motor drive comprising:

a plurality of phase lines configured to connect an output of a power source to an input of a motor, wherein the power source is configured to supply at the output of the power source a voltage that switches between a high voltage state and a low voltage state;

a plurality of capacitors, wherein each capacitor is connected between one of the plurality of phase lines and a ground;

a plurality of primary inductors, wherein each phase line comprises one of the plurality of primary inductors; and a plurality of secondary inductors and a plurality of resistors, wherein each of the plurality of secondary inductors is connected in series with one of the plurality of resistors, wherein each of the plurality of primary inductors is connected in parallel to one of the plurality of secondary inductors and one of the plurality of resistors, wherein the plurality of secondary inductors each have a lower inductance than the plurality of primary inductors.

* * * * *